United States Patent
Kitazume et al.

(10) Patent No.: US 11,065,735 B2
(45) Date of Patent: Jul. 20, 2021

(54) MANUFACTURING METHOD OF CARRIER FOR DOUBLE-SIDE POLISHING APPARATUS AND METHOD OF DOUBLE-SIDE POLISHING WAFER

(71) Applicant: SHIN-ETSU HANDOTAI CO., LTD., Tokyo (JP)

(72) Inventors: Daichi Kitazume, Nishigo-mura (JP); Yuki Tanaka, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 556 days.

(21) Appl. No.: 16/078,327

(22) PCT Filed: Feb. 17, 2017

(86) PCT No.: PCT/JP2017/005950
§ 371 (c)(1),
(2) Date: Aug. 21, 2018

(87) PCT Pub. No.: WO2017/159213
PCT Pub. Date: Sep. 21, 2017

(65) Prior Publication Data
US 2019/0047113 A1    Feb. 14, 2019

(30) Foreign Application Priority Data

Mar. 18, 2016    (JP) .............................. JP2016-056089

(51) Int. Cl.
*B24B 7/17* (2006.01)
*B24B 37/28* (2012.01)
(Continued)

(52) U.S. Cl.
CPC ................ *B24B 37/28* (2013.01); *B24B 7/17* (2013.01); *B24B 27/0076* (2013.01);
(Continued)

(58) Field of Classification Search
CPC ..... B28B 7/17; B28B 27/0076; B28B 37/042; B28B 37/044; B28B 37/048; B28B 37/08; B28B 37/28
(Continued)

(56) References Cited

U.S. PATENT DOCUMENTS

| 6,454,635 B1* | 9/2002 | Zhang | ..................... B24B 37/28 |
| | | | 29/402.08 |
| 7,008,308 B2* | 3/2006 | Bjelopavlic | ............. B24B 37/28 |
| | | | 451/269 |

(Continued)

FOREIGN PATENT DOCUMENTS

| JP | 2009-202259 A | 9/2009 |
| JP | 2014-176954 A | 9/2014 |

(Continued)

OTHER PUBLICATIONS

May 23, 2017 International Search Report issued in International Patent Application No. PCT/JP2017/005950.

*Primary Examiner* — Eileen P Morgan
(74) *Attorney, Agent, or Firm* — Oliff PLC

(57) ABSTRACT

A manufacturing method of a carrier for a double-side polishing apparatus, including: preparing a carrier base material and insert thicker than the carrier base material, inserting the insert into a holding hole so as to protrude the insert from both sides of the front surface and back surface of the carrier base material, measuring each of a front protruding amount of the insert protruded from front surface of the carrier base material and a back protruding amount of the insert protruded from back surface of the carrier base material, setting each rotational speed of the upper turn table and lower turn table in starting-up polishing of the carrier so as to decrease the difference between the front protruding amount and back protruding amount, and a starting-up (Continued)

polishing step to subject the carrier to starting-up polishing at each set rotational speed of the upper turn table and the lower turn table.

20 Claims, 6 Drawing Sheets

(51) Int. Cl.
*B24B 37/08* (2012.01)
*B24B 37/04* (2012.01)
*B24B 27/00* (2006.01)
*H01L 21/02* (2006.01)

(52) U.S. Cl.
CPC .......... *B24B 37/042* (2013.01); *B24B 37/044* (2013.01); *B24B 37/08* (2013.01); *H01L 21/02005* (2013.01)

(58) Field of Classification Search
USPC ...... 451/10, 11, 41, 262, 268, 269, 287, 288
See application file for complete search history.

(56) References Cited

U.S. PATENT DOCUMENTS

| | | | |
|---|---|---|---|
| 9,327,382 B2 * | 5/2016 | Ueno | .................... B24B 37/042 |
| 2011/0104995 A1 | 5/2011 | Ueno et al. | |
| 2015/0217425 A1 * | 8/2015 | Sasaki | ..................... B24B 37/28 |
| | | | 451/57 |
| 2015/0375363 A1 | 12/2015 | Sato et al. | |
| 2017/0069502 A1 | 3/2017 | Sato et al. | |
| 2017/0312878 A1 * | 11/2017 | Yasuda | ................... B24B 37/08 |

FOREIGN PATENT DOCUMENTS

| | | |
|---|---|---|
| JP | 2015-174168 A | 10/2015 |
| JP | 2016-198864 A | 12/2016 |

* cited by examiner

MANUFACTURING METHOD OF CARRIER FOR DOUBLE-SIDE POLISHING APPARATUS AND METHOD OF DOUBLE-SIDE POLISHING WAFER

TECHNICAL FIELD

The present invention relates to a manufacturing method of a carrier for a double-side polishing apparatus and a method of double-side polishing a wafer.

BACKGROUND ART

In a double-side polishing apparatus, the both sides of about 5 pieces of wafers are polished simultaneously per 1 batch. Accordingly, a carrier for a double-side polishing apparatus is installed having the same number of holding holes as the number of the wafers. Wafers are held in the holding holes of the carrier and sandwiched between polishing pads attached to the upper and lower turn tables from the both sides, and the wafers are polished while supplying a polishing agent to the polishing surfaces.

The carrier for a double-side polishing apparatus is formed in a thickness thinner than the wafers, and is composed of a metal such as stainless or titanium, or a hard resin such as glass epoxy. Among these, the metal carrier has an insert made from a resin on the inside of the wafer holding hole so as not to bring the inner circumferential portion of the wafer holding hole into contact with the outer circumferential portion of the wafer to cause breakage. This insert is formed by insertion or injection molding.

The insertion of the insert into the holding hole can be performed by the method described in Patent Literature 1, for example, in which an insert subjected to lapping and polishing is inserted into a carrier base material, and subjected to adhesion and drying while vertical loading is applied to the insert.

The inner circumferential portion of the insert is brought into contact with the outer circumferential portion of a wafer, and hence is important on forming the edge shape of the wafer. This insert is desirable to have the same height as that of the carrier base material. Accordingly, a thicker insert have to be inserted, followed by starting-up polishing of a carrier to process the protruded portions.

The reason why this insert is desired to have the same height as that of the carrier base material is that the height of the insert varies retainer effects that acts on the edge portion of a wafer. The retainer effect acts to prevent the edge portion of a wafer from largely sagging. Accordingly, a sag or rise shape of the edge portion is influenced by the height of an insert and the thickness of a wafer.

At present, the flatness of each edge portion of a wafer is varied from the front surface to the back surface after double-side polishing. One of this reason is the variation in thickness of an insert and a carrier base material. In order to reduce the variation in thickness, insert resins have been inserted into a carrier after being polished to be uniform in thickness previously.

CITATION LIST

Patent Literature

Patent Document 1: Japanese Unexamined Patent Publication (Kokai) No. 2014-176954

SUMMARY OF INVENTION

Problem to be Solved by the Invention

At the point of inserting an insert into a carrier base material, however, it is difficult to insert the insert symmetrically about the front surface and the back surface, and the insert is fixed being deviated to the front surface or the back surface. As a result, the front surface and the back surface cause to have different step heights between the carrier base material and the insert.

This difference of step heights can be somewhat moderated by ordinary starting-up polishing. However, each stock removal of the front surface and the back surface of the insert cannot be controlled, and the symmetry about the front surface and the back surface remains worse. Accordingly, double-side polishing of a wafer using such a carrier causes a problem that the flatness of the edge portion of the wafer deteriorates after the double-side polishing.

The present invention was accomplished in view of the above-described problems. It is an object of the present invention to provide a manufacturing method of a carrier for a double-side polishing apparatus and a method of double-side polishing a wafer capable of improving the flatness at the edge portion of a wafer after the double-side polishing.

Means for Solving Problem

To achieve the object described above, the present invention provides a manufacturing method of a carrier for a double-side polishing apparatus, the double-side polishing apparatus including an upper turn table and a lower turn table to which polishing pads are attached, and the carrier including a carrier base material having a holding hole formed therein to hold a wafer, and an insert disposed along the inner circumference of the holding hole and having an inner circumferential portion configured to be in contact with an outer circumferential portion of the wafer, the method comprising:
- a preparation step of preparing the carrier base material and the insert thicker than the carrier base material;
- a step of inserting the insert into the holding hole so as to protrude the insert from both sides of the front surface and the back surface of the carrier base material;
- a measuring step to measure each of a front protruding amount of the insert protruded from the front surface of the carrier base material and a back protruding amount of the insert protruded from the back surface of the carrier base material;
- a setting step to set each rotational speed of the upper turn table and the lower turn table in starting-up polishing of the carrier so as to decrease a difference between the front protruding amount and the back protruding amount; and
- a starting-up polishing step to subject the carrier to starting-up polishing at each set rotational speed of the upper turn table and the lower turn table.

This makes it possible to decrease the difference between the front protruding amount and the back protruding amount of an insert protruded from a carrier base material to improve the symmetry of the insert about the front surface and the back surface of the carrier base material. This makes it possible to manufacture a carrier for a double-side polishing apparatus that is capable of improving the flatness at the edge portion of a wafer after the double-side polishing.

In the preparation step, it is preferable that the insert is prepared in a thickness thicker than the thickness of the carrier base material by 10 μm or more and 40 μm or less.

This allows the insert to be inserted into a holding hole smoothly in the insertion step and makes it possible to prevent the starting-up polishing step from being elongated.

In the setting step, it is preferable that each rotational speed of the upper turn table and the lower turn table is set to have a relative rotational speed to the carrier in starting-up polishing of the carrier such that the relative rotational speed of one of the upper turn table and the lower turn table is set to 1.5 times or more relative to the relative rotational speed of the other.

This makes it possible to decrease the difference of the protruding amounts sufficiently, and to set rotational speeds to perform starting-up polishing of a carrier more efficiently.

In the setting step, it is preferable that each rotational speed of the upper turn table and the lower turn table is set to have a relative rotational speed to the carrier being 0 rpm or more and 30 rpm or less in starting-up polishing of the carrier.

This makes it possible to set rotational speeds that allow the starting-up polishing of the carrier to be performed more efficiently.

It is preferable that the starting-up polishing step is performed using an aqueous alkaline solution in which a polishing agent having an average adhesive-grain diameter of 60 nm or more is diluted 2 to 5 times with a solvent.

This allows the starting-up polishing to be performed efficiently.

It is preferable that the measuring step is performed again after the starting-up polishing step, and the setting step, the starting-up polishing step, and the measuring step are repeated until the difference between the front protruding amount and the back protruding amount measured in the measuring step reaches to 5 μm or less.

This allows the insert to securely improve the symmetry about the front surface and the back surface of a carrier base material.

This also provides a method of double-side polishing a wafer, comprising:

disposing the carrier manufactured by the inventive manufacturing method of a carrier for a double-side polishing apparatus described above between an upper turn table and a lower turn table to which polishing pads are attached; and double-side polishing the wafer while holding the wafer in the holding hole formed in the carrier.

This makes it possible to securely improve the flatness of the edge portion of a wafer after the double-side polishing.

Effect of Invention

The inventive manufacturing method of a carrier for a double-side polishing apparatus makes it possible to decrease the difference between the front protruding amount and the back protruding amount of an insert protruded from a carrier base material. As a result, the insert is allowed to have improved symmetry about the front surface and the back surface of the carrier base material. This makes it possible to improve the flatness of the edge portion of a wafer after double-side polishing.

DESCRIPTION OF EMBODIMENTS

Hereinafter, the embodiments of the present invention will be described, but the present invention is not limited thereto.

As described above, when insertion of an insert into a carrier base material causes fixing of the insert deviated to the front surface (or the back surface) and such a carrier is used for double-side polishing of a wafer, there is a problem that the flatness of the edge portion of the wafer deteriorates after the double-side polishing.

Accordingly, the inventors have diligently investigated to solve the problem. As a result, the inventors have found a method that involves measuring each of a front protruding amount and a back protruding amount of an insert protruded from a carrier base material, setting each rotational speed of the upper turn table and the lower turn table in starting-up polishing of the carrier so as to decrease the difference between the front protruding amount and the back protruding amount, and starting-up polishing the carrier at each of these set rotational speeds of the upper turn table and the lower turn table. The inventors have conceived that this makes it possible to decrease the difference between the front protruding amount and the back protruding amount of the insert protruded from the carrier base material to improve the symmetry of the insert about the front surface and the back surface of the carrier base material, thereby allowing the edge portion of the wafer to have improved flatness after the double-side polishing. Additionally, the inventors have minutely investigated the best mode for operating these, thereby bringing the present invention to completion.

Figure 2:
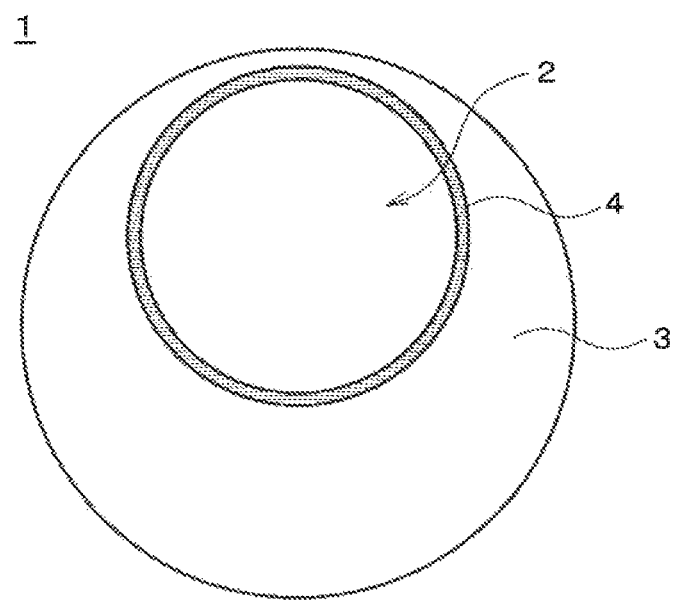
FIG. 2 is a schematic diagram to show an example of a carrier for a double-side polishing apparatus manufactured by the inventive manufacturing method.

An example of a carrier for a double-side polishing apparatus is shown in FIG. 2. A carrier 1 comprises a carrier base material 3 in which a holding hole 2 configured to hold a wafer is formed, together with an insert 4 disposed along the inner circumference of the holding hole 2 of the carrier base material 3 and having an inner circumferential portion configured to be in contact with the outer circumferential portion of the wafer. The insert 4 allows the chamfered portion of the wafer to be protected.

Figure 3:
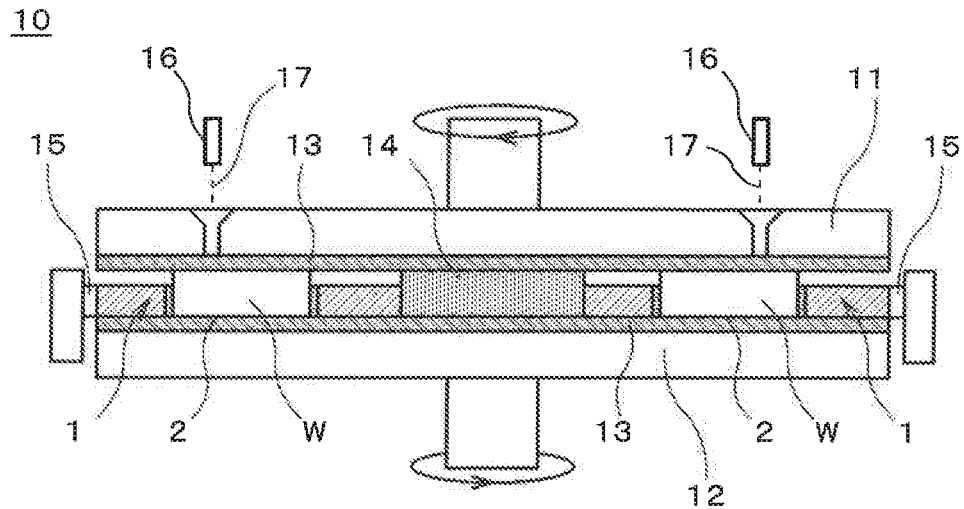
FIG. 3 is a schematic diagram to show an example of a double-side polishing apparatus usable for the inventive manufacturing method of a carrier for a double-side polishing apparatus.

The carrier 1 like this is usable for a four-way type double-side polishing apparatus 10 as shown in FIG. 3, for example, when a wafer W is subjected to double-side polishing. The double-side polishing apparatus 10 is provided with an upper turn table 11 and a lower turn table 12 that are facing each other and located upward and downward. To each of the upper and lower turn tables 11 and 12, a polishing pad 13 is attached. At the center between the upper turn table 11 and the lower turn table 12 is provided a sun gear 14; at a circumferential portion therebetween is provided an internal gear 15.

Each tooth of the sun gear 14 and the internal gear 15 is engaged with the outer circumferential teeth of the carrier 1. As the upper turn table 11 and the lower turn table 12 are driven to rotate by a driving source, which is not shown in FIGS., the carrier 1 revolves around the sun gear 14 while rotating. During this time, the both surfaces of the wafer W held in the holding hole 2 of the carrier 1 are polished simultaneously with the upper and lower polishing pads 13. In the polishing of the wafer W, slurry 17 is fed to the polishing surface of the wafer W through a slurry feeding device 16.

Hereinafter, the inventive manufacturing method of a carrier for a double-side polishing apparatus will be described by referring to FIG. 1 to FIG. 3.

Figure 1:
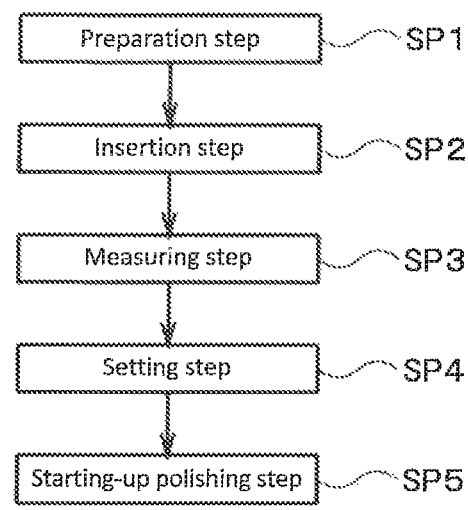
FIG. 1 is a process drawing to show an example of the inventive manufacturing method of a carrier.

First, a preparation step is performed to prepare the carrier base material 3 and the insert 4 that is thicker than the carrier base material 3 as shown in FIG. 2 (SP1 in FIG. 1). Here exemplifies the carrier base material 3 that has one holding hole 2, but the carrier base material may also have a plurality of holding holes, not to be limited to this example.

In this step, it is preferable to prepare the insert 4 that is thicker than the thickness of the carrier base material 3 by 10 µm or more and 40 µm or less, more preferably by 15 µm or more and 25 µm or less. This allows the insert to be inserted into a holding hole smoothly in the insertion step, which will be described later, and makes it possible to prevent the starting-up polishing step described later from being elongated.

As the insert 4, it is preferable to prepare the one made from a hard resin. As the carrier base material 3, it is preferable to prepare the one made from a metal such as stainless or titanium, for example, or surface-hardening-treated one thereof. The present invention, however, is not particularly limited to these materials.

Then, an insertion step is performed to insert the insert 4 into the holding hole 2 so as to protrude the insert 4 from both sides of the front surface and the back surface of the carrier base material 3 (SP2 in FIG. 1).

Subsequently, a measuring step is performed to measure each of a front protruding amount of the insert 4 protruded from the front surface of the carrier base material 3 and a back protruding amount of the insert 4 protruded from the back surface of the carrier base material (SP3 in FIG. 1).

In this step, the front protruding amount and the back protruding amount (step height) can be measured with a contact type step measuring apparatus, for example.

Next, a setting step is performed to set each rotational speed of the upper turn table 11 and the lower turn table 12 in starting-up polishing of the carrier 1 so as to decrease the difference between the front protruding amount and the back protruding amount (SP4 in FIG. 1).

Specifically, the stock removal of the insert 4 on the front surface and the back surface can be controlled by increasing the relative rotational speed of the turn table at the side on which the protruding amount of the insert 4 is larger, or by decreasing the relative rotational speed of the turn table at the side on which the protruding amount of the insert 4 is smaller, for example. The relative rotational speed may be set with reference to the ratio of the front protruding amount and the back protruding amount, for example. In this case, it is not altogether necessary for absolute value of the ratio of the protruding amounts to coincide that of the ratio of the rotational speeds. The relative rotational speed can be easily set by previously determining the relationship between the polishing speed of the insert and the rotational speed of the turn table.

In this step, it is preferable to set each rotational speed of the upper turn table 11 and the lower turn table 12 to have a relative rotational speed to the carrier 1 in starting-up polishing of the carrier 1 such that the relative rotational speed of one of the upper turn table and the lower turn table is set to 1.5 times or more compared to the relative rotational speed of the other. This makes it possible to decrease the difference of the protruding amounts sufficiently, and to set rotational speeds to perform starting-up polishing of the carrier 1 more efficiently.

Incidentally, it is sufficient to set one of the relative rotational speed compared to the relative rotational speed of the other to four times in view of the efficiency.

In this step, it is preferable to set each rotational speed of the upper turn table 11 and the lower turn table 12 such that each relative rotational speed of the upper turn table 11 and the lower turn table 12 to the carrier 1 is 0 rpm or more and 30 rpm or less in starting-up polishing of the carrier 1. This makes it possible to set rotational speeds that allow the starting-up polishing of the carrier 1 to be performed more efficiently.

The carrier 1 is subjected to a starting-up polishing step at each rotational speed of the upper turn table 11 and the lower turn table 12 set in the setting step described above (SP5 in FIG. 1).

In this step, it is preferable to use an aqueous alkaline solution in which a polishing agent having an average adhesive-grain diameter of 60 nm or more is diluted 2 to 5 times with a solvent. This allows the starting-up polishing to be performed more efficiently.

It is to be noted that the average adhesive-grain diameter of 100 nm is sufficient in view of the efficiency.

As the polishing pad 13, it is preferably to use a foamed urethane pad with the Shore A hardness of 85 to 95.

Figure 4:
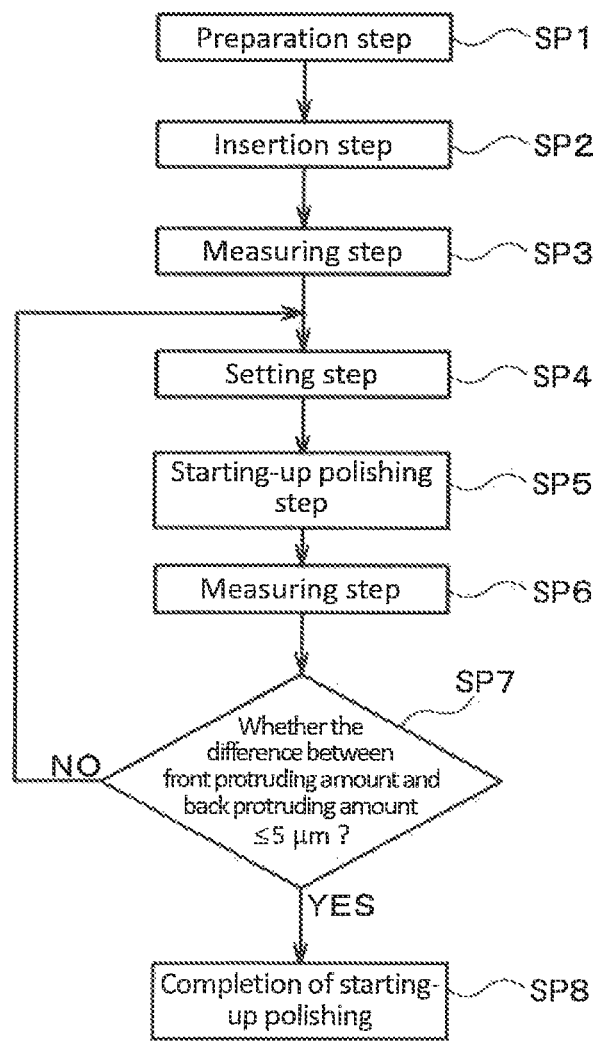
FIG. 4 is a process drawing to show another example of the inventive manufacturing method of a carrier.

In this stage, it is preferable to perform the measuring step (SP6) again after the starting-up polishing step (SP5), and to repeat the setting step (SP4), the starting-up polishing step (SP5), and the measuring step (SP6) until the difference between the front protruding amount and the back protruding amount measured in the measuring step (SP6) reaches to 5 µm or less, more preferably 2 µm or less, still more preferably 1 µm as shown in FIG. 4. This allows the insert 4 to securely improve the symmetry about the front surface and the back surface of the carrier base material 3.

It is to be noted that the difference itself is preferable when it is smaller. It is also possible to repeat the steps described above until the difference disappears (the difference becomes 0 µm) if necessary.

Specifically, it is preferable to perform a decision step (SP7) to decide whether the difference between the front protruding amount and the back protruding amount is equal to or less than the prescribed value, for example, after the measuring step (SP6). This makes it possible to decide to perform the setting step (SP4) again when the difference between the front protruding amount and the back protruding amount is larger than the prescribed value, and to complete the starting-up polishing (SP8) when the difference between the front protruding amount and the back protruding amount is equal to or less than the prescribed value.

The inventive manufacturing method of a carrier for a double-side polishing apparatus described above makes it possible to decrease the difference between the front protruding amount and the back protruding amount of an insert protruded from a carrier base material. As a result, the insert is allowed to have improved symmetry about the front surface and the back surface of the carrier base material. This makes it possible to improve the flatness of the edge portion of a wafer after the double-side polishing.

Additionally, in the inventive method of double-side polishing a wafer, double-side polishing is performed by disposing the carrier manufactured by the inventive manufacturing method of a carrier for a double-side polishing apparatus described above between an upper turn table and a lower turn table to which polishing pads are attached, and holding the wafer in the holding hole formed in the carrier. This makes it possible to improve the flatness of the edge portion of a wafer after the double-side polishing.

Specifically, the wafer W is held in the holding hole 2 of the carrier 1 as shown in FIG. 3, for example. Subsequently, the carrier 1 holding the wafer W is inserted between the upper and lower turn tables 11 and 12 of the double-side polishing apparatus 10. Then, the carrier 1 is rotated and revolved simultaneously with rotating the upper and lower turn tables 11 and 12 while feeding the slurry 17 to the polishing surface through the slurry feeding device 16. Thus, it is possible to perform double-side polishing of the wafer W by bringing the both surfaces of the wafer W into sliding contact with the polishing pads 13.

The embodiment described above depicts a carrier that had only one holding hole as shown in FIG. 2. The present invention, however, is not limited thereto, and can be applied to the one provided with plurality of holding holes and corresponding inserts in one carrier.

EXAMPLE

Hereinafter, the present invention will be more specifically described by showing Example and Comparative Example, but the present invention is not limited thereto.

Example

A carrier base material made from pure titanium was prepared having the surface subjected to DLC coating treatment with the thickness of about 2 μm and having a thickness of about 776 μm after the coating. An insert of a glass fiber reinforced epoxy resin (EG) was prepared having a thickness of 790 to 800 μm and being subjected to lapping and polishing previously (preparation step).

The insert was inserted into the holding hole so as to protrude the insert from both sides of the front surface and the back surface of the carrier base material (insertion step).

Figure 5:
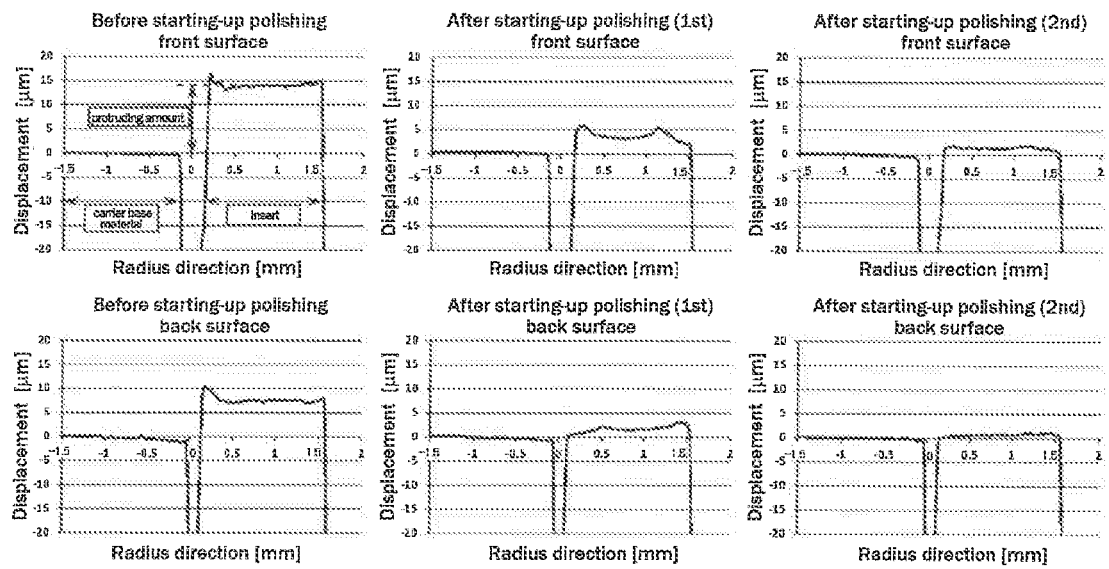
FIG. 5 is a graph to show profiles of front protruding amounts and back protruding amounts measured in Example.

The front protruding amount of the insert protruded from the front surface of the carrier base material and the back protruding amount of the insert protruded from the back surface of the carrier base material were each measured (measuring step). The measurements of the front protruding amount and the back protruding amount were performed using Surftest SJ-400 manufactured by Mitsutoyo Corporation. The results are shown in FIG. 5 and FIG. 6, together with the measured results after starting-up polishing that will be described later.

Figure 6:
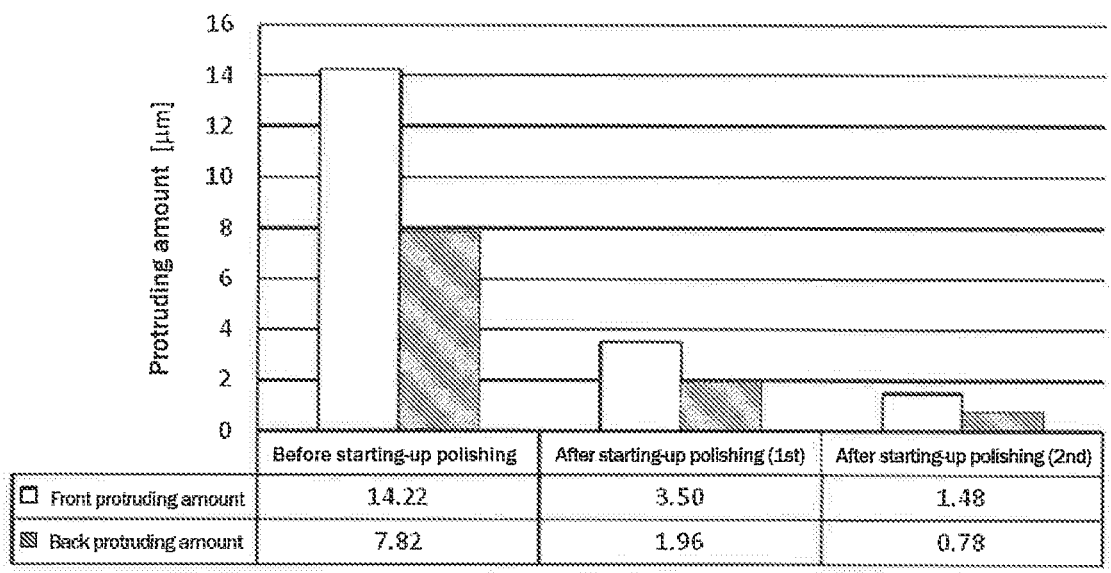
FIG. 6 is a graph to show front protruding amounts and back protruding amounts measured in Example.

As the result, the front protruding amount was 14.22 μm and the back protruding amount was 7.82 μm before the starting-up polishing as shown in FIG. 6. That is, the difference between the front protruding amount and the back protruding amount was 6.4 μm, and the ratio thereof was 1.82 before the starting-up polishing.

The rotational speeds of the upper turn table and the lower turn table in starting-up polishing of the carrier were set so as to decrease the difference between the front protruding amount and the back protruding amount (setting step). At each of these set rotational speeds of the upper and lower turn table, starting-up polishing was performed on the carrier (starting-up polishing step).

Then, the measuring step was performed again after the starting-up polishing step to repeat the setting step, the starting-up polishing step, and the measuring step until the difference between the front protruding amount and the back protruding amount measured in the measuring step reached to 1 μm or less.

In the setting step, the rotational speeds were set as shown in Table 1 below about relative rotational speeds of the upper turn table and the lower turn table to the carrier in starting-up polishing the carrier such that the ratio of the relative rotational speed of the upper turn table to the relative rotational speeds of the lower turn table was 2 in the starting-up polishing (at the first time) and 1.5 in the starting-up polishing (at the second time). The times of the starting-up polishing were set to 60 minutes in the starting-up polishing (at the first time) and 120 minutes in the starting-up polishing (at the second time).

TABLE 1

| | Starting-up polishing time (min) | Relative rotational speeds of upper turn table/Relative rotational speeds of lower turn table |
| --- | --- | --- |
| Starting-up polishing (1st) | 60 | 2.0 |
| Starting-up polishing (2nd) | 120 | 1.5 |

In the starting-up polishing of a carrier, the double-side polishing apparatus DPS-20B manufactured by Fujikoshi Machinery Corp. was used, in which SF 5000 manufactured by Fujibo Ehime Co., Ltd., which is a foamed urethane pad having a shore A hardness of 90, was attached to each of the upper and lower turn tables as a polishing pad. In the starting-up polishing of a carrier, KOH-base aqueous alkaline solution with the pH of 10.5 was used as the slurry in which a polishing agent COMPOL 80 manufactured by Fujimi Incorporated having an average adhesive-grain diameter of 77 nm had been diluted 3 times with a solvent to have an adhesive-grain concentration of 13.5 wt %.

As shown in FIG. 6, the front protruding amount was 3.50 μm and the back protruding amount was 1.96 μm after the starting-up polishing of the carrier (at the first time). That is, the difference between the front protruding amount and the back protruding amount was 1.54 μm after the starting-up polishing of the carrier (at the first time).

Additionally, the front protruding amount was 1.48 μm and the back protruding amount was 0.78 μm after the starting-up polishing between the carrier (at the second time). That is, the difference between the front protruding amount and the back protruding amount was 0.7 μm after the starting-up polishing of the carrier (at the second time).

As described above, the difference between the front protruding amount and the back protruding amount had reached to 1 μm or less after the starting-up polishing of the carrier (at the second time). Accordingly, the starting-up polishing of the carrier was completed at this time.

Comparative Example

Figure 7:
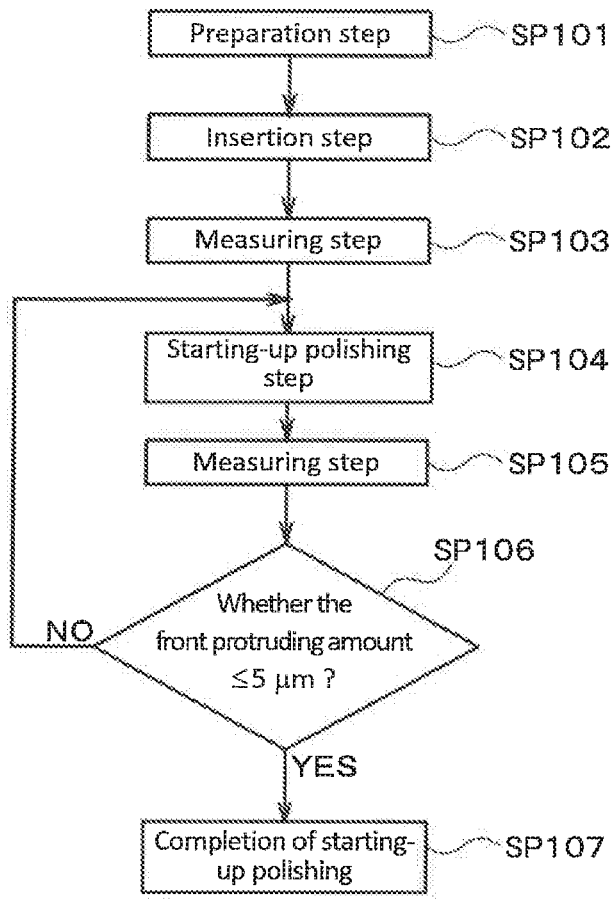
FIG. 7 is a process drawing to show the manufacturing method of a carrier in Comparative Example.

A carrier for a double-side polishing apparatus was manufactured using the same double-side polishing apparatus as in Example in accordance with the process drawing shown in FIG. 7.

After preparation of the same carrier base material as in Example and an insert having a thickness of 780 to 790 μm and being subjected to lapping and polishing previously (SP101 in FIG. 7), ordinary insertion was performed thereon (SP102) in the first place. Then, displacements on the front surface and the back surface of the carrier base material were measured as in Example (SP103 in FIG. 7). The results are shown in FIG. 8 and FIG. 9, together with the measured results after starting-up polishing that will be described later.

Figure 8:
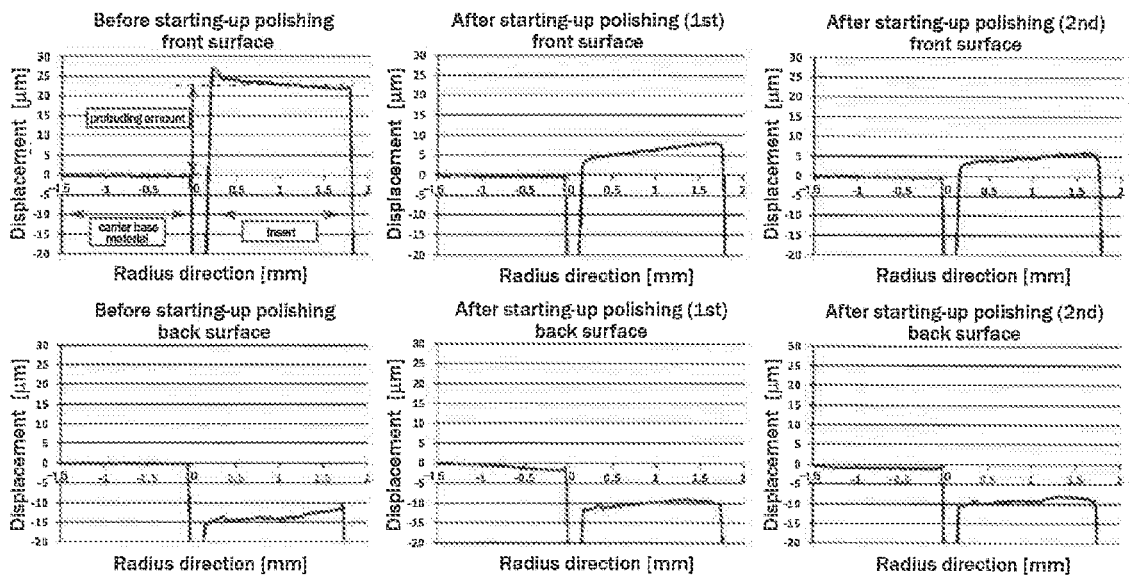
FIG. 8 is a graph to show profiles of front protruding amounts and back protruding amounts measured in Comparative Example.
Figure 9:
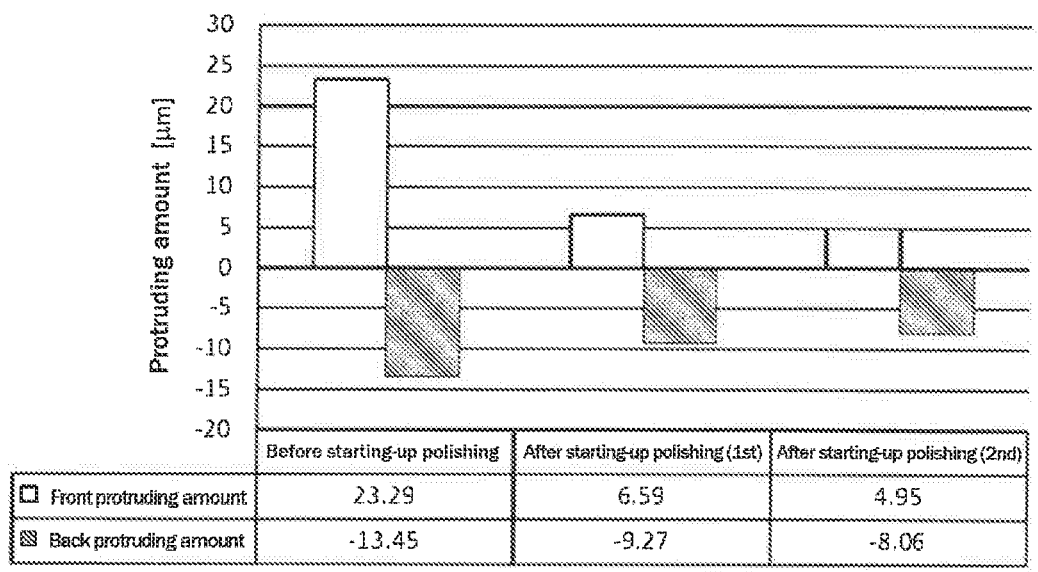
FIG. 9 is a graph to show front protruding amounts and back protruding amounts measured in Comparative Example.

As the result, the insert was largely deviated to the front surface at the time of inserting the insert in Comparative Example as shown in FIG. 8 and FIG. 9. The front protruding amount was 23.29 μm and the back protruding amount was −13.45 μm before the starting-up polishing step.

Subsequently, the ordinary starting-up polishing (SP104 in FIG. 7) was performed, and then the measuring step was performed again (SP105 in FIG. 7) to repeat the starting-up polishing step and the measuring step until the front protruding amount measured in the measuring step reached to 5 μm or less (SP106 in FIG. 7).

In the starting-up polishing step, the relative rotational speeds of the upper turn table and the lower turn table to the carrier in starting-up polishing were set as in the ordinary double-side polishing of a wafer such that the relative rotational speed of the upper turn table and the relative rotational speed of the lower turn table were equal as shown in Table 2. The times of the starting-up polishing were set to 60 minutes in the starting-up polishing (at the first time) and 150 minutes in the starting-up polishing (at the second time).

TABLE 2

| | Starting-up polishing time (min) | Relative rotational speeds of upper turn table/Relative rotational speeds of lower turn table |
|---|---|---|
| Starting-up polishing (1st) | 60 | 1.0 |
| Starting-up polishing (2nd) | 150 | 1.0 |

As shown in FIG. 9, the front protruding amount after the starting-up polishing of the carrier (at the first time) was 6.59 μm, and the front protruding amount after the starting-up polishing of the carrier (at the second time) was 4.95 μm in Comparative Example. Accordingly, the front protruding amount had reached to 5 μm or less after the starting-up polishing of the carrier (at the second time), and the starting-up polishing of the carrier was completed at this time thereby.

As shown in FIG. 8 and FIG. 9, however, in the carrier manufactured in Comparative Example, the insert had been largely deviated to the front surface at the time of inserting the insert. This protruding amount could not be corrected by ordinary starting-up polishing, and the carrier base material remained to have worse symmetry about the front surface and the back surface.

On the other hand, in Example, although the insert was fixed being deviated to the front surface at the time of inserting the insert, the insert protruded to the both surfaces. Since the protruding amount was larger at the front surface based on the results of measuring the step height before the starting-up polishing, the starting-up polishing was performed such that the relative rotational speed of the upper turn table to the carrier was set to larger than the relative rotational speed of the lower turn table to the carrier. As a result, Example succeeded to manufacture a carrier in which the insert had better symmetry about the front surface and the back surface of the carrier base material after the starting-up polishing compared to that in Comparative Example.

In each of Example and Comparative Example, a plurality of carriers were manufactured in the same way.

By using these manufactured carriers, double-side polishing was performed on silicon wafers with a diameter of 300 mm for total 5 batches.

In the double-side polishing of a wafer, the double-side polishing apparatus DPS-20B manufactured by Fujikoshi Machinery Corp. was used, in which SF 5000 manufactured by Fujibo Ehime Co., Ltd., which is a foamed urethane pad having a shore A hardness of 90, was attached to each of the upper and lower turn tables as a polishing pad, as in the starting-up polishing of a carrier.

In the double-side polishing of a wafer, KOH-base aqueous alkaline solution with the pH of 10.5 was used as the slurry in which 1:1 mixture of RDS-H11201 and RDS-H11202 (the average adhesive-grain diameter of 74 nm and 89 nm) of a silica-base adhesive-grain manufactured by Fujimi Incorporated had been diluted to have an adhesive-grain concentration of 2.4 wt %.

Figure 10:
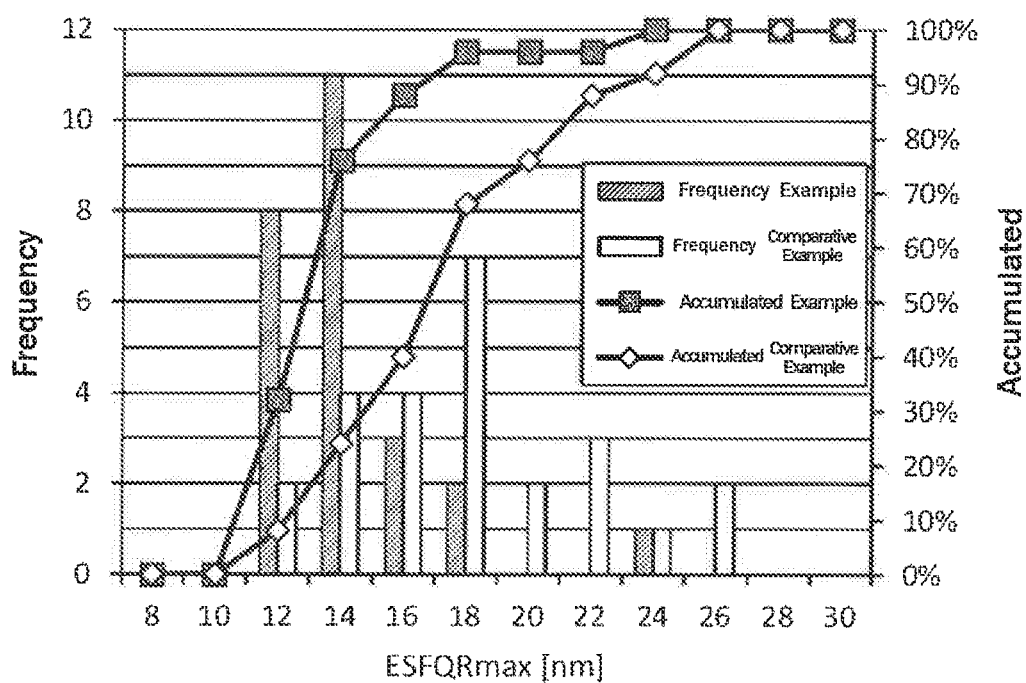
FIG. 10 is a graph to show measured results of $ESFQR_{max}$ of each wafer after double-side polishing in Example and Comparative Example.
Figure 11:
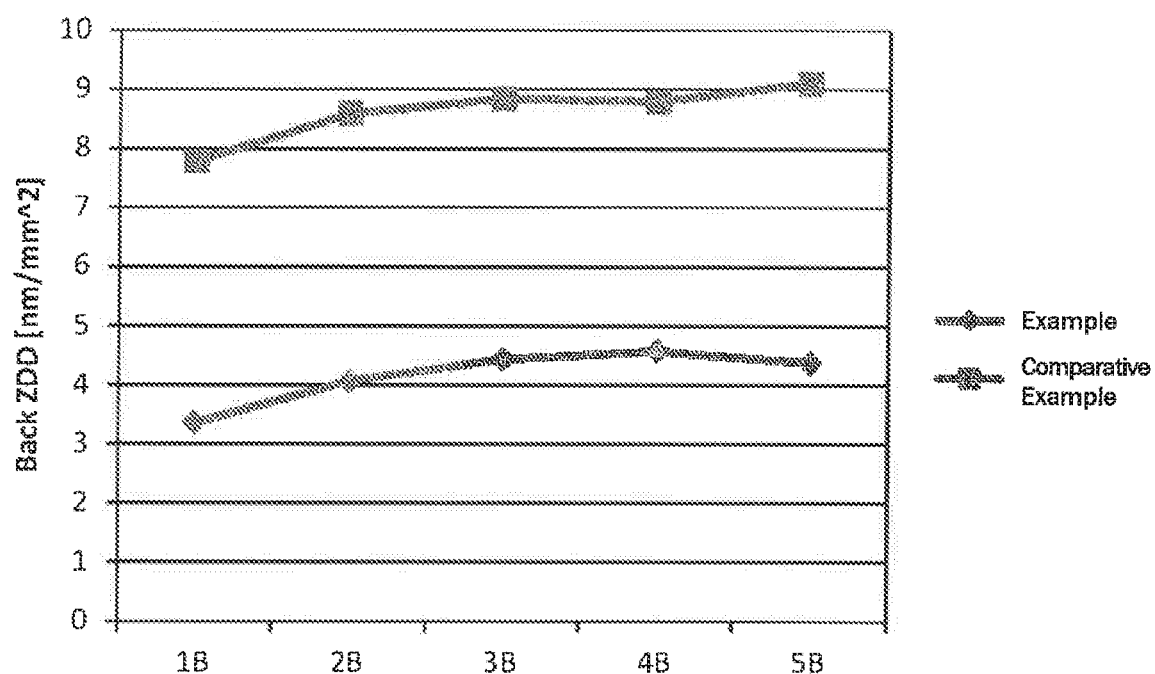
FIG. 11 is a graph to show measured results of Back-ZDD of each wafer after double-side polishing in Example and Comparative Example.

Then, the wafer after double-side polishing was measured for flatness at the edge portion. The flatness was measured with Wafer Sight 2 manufactured by KLA-Tencor Co., Ltd. The measured results of flatness on the front surface of the wafer after double-side polishing (ESFQR$_{max}$) are shown in FIG. 10. The measured results of flatness on the back surface of the wafer after double-side polishing (Back-ZDD) are shown in FIG. 11.

As the result, the average value of ESFQR$_{max}$ was 17.1 nm in Comparative Example. On the other hand, in Example, the average value of ESFQR$_{max}$ was improved to 13.5 nm. The average value of Back-ZDD was 8.6 nm/mm$^2$ in Comparative Example. On the other hand, in Example, the average value of Back-ZDD was improved to 4.2 nm/mm$^2$. As can be seen from the above, Back-ZDD has been liable to be deteriorated previously as in Comparative Example. In Example, however, Back-ZDD was successfully improved largely.

As described above, the inventive manufacturing method of a carrier succeeded to improve the symmetry of an insert about the front surface and the back surface of a carrier base material to improve the flatness at the edge portion of a wafer after double-side polishing.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A manufacturing method of a carrier for a double-side polishing apparatus, the double-side polishing apparatus including an upper turn table and a lower turn table to which polishing pads are attached, and the carrier including a carrier base material having a holding hole formed therein to hold a wafer, and an insert disposed along the inner circumference of the holding hole and having an inner circumferential portion configured to be in contact with an outer circumferential portion of the wafer, the method comprising:
 a preparation step of preparing the carrier base material and the insert thicker than the carrier base material;
 a step of inserting the insert into the holding hole so as to protrude the insert from both sides of the front surface and the back surface of the carrier base material;
 a measuring step to measure each of a front protruding amount of the insert protruded from the front surface of the carrier base material and a back protruding amount of the insert protruded from the back surface of the carrier base material;
 a setting step to set each rotational speed of the upper turn table and the lower turn table in starting-up polishing of the carrier so as to decrease a difference between the front protruding amount and the back protruding amount; and
 a starting-up polishing step to subject the carrier to starting-up polishing at each set rotational speed of the upper turn table and the lower turn table.

2. The manufacturing method of a carrier for a double-side polishing apparatus according to claim 1, wherein, in the preparation step,
 the insert is prepared in a thickness thicker than the thickness of the carrier base material by 10 μm or more and 40 μm or less.

3. The manufacturing method of a carrier for a double-side polishing apparatus according to claim 1, wherein, in the setting step,
 each rotational speed of the upper turn table and the lower turn table is set to have a relative rotational speed to the carrier in starting-up polishing of the carrier such that the relative rotational speed of one of the upper turn table and the lower turn table is set to 1.5 times or more relative to the relative rotational speed of the other.

4. The manufacturing method of a carrier for a double-side polishing apparatus according to claim 2, wherein, in the setting step,
 each rotational speed of the upper turn table and the lower turn table is set to have a relative rotational speed to the carrier in starting-up polishing of the carrier such that the relative rotational speed of one of the upper turn table and the lower turn table is set to 1.5 times or more relative to the relative rotational speed of the other.

5. The manufacturing method of a carrier for a double-side polishing apparatus according to claim 1, wherein, in the setting step,
 each rotational speed of the upper turn table and the lower turn table is set to have a relative rotational speed to the carrier being 0 rpm or more and 30 rpm or less in starting-up polishing of the carrier.

6. The manufacturing method of a carrier for a double-side polishing apparatus according to claim 2, wherein, in the setting step,
 each rotational speed of the upper turn table and the lower turn table is set to have a relative rotational speed to the carrier being 0 rpm or more and 30 rpm or less in starting-up polishing of the carrier.

7. The manufacturing method of a carrier for a double-side polishing apparatus according to claim 3, wherein, in the setting step,
 each rotational speed of the upper turn table and the lower turn table is set to have a relative rotational speed to the carrier being 0 rpm or more and 30 rpm or less in starting-up polishing of the carrier.

8. The manufacturing method of a carrier for a double-side polishing apparatus according to claim 4, wherein, in the setting step,
 each rotational speed of the upper turn table and the lower turn table is set to have a relative rotational speed to the carrier being 0 rpm or more and 30 rpm or less in starting-up polishing of the carrier.

9. The manufacturing method of a carrier for a double-side polishing apparatus according to claim 1,
 wherein the starting-up polishing step is performed using an aqueous alkaline solution in which a polishing agent having an average adhesive-grain diameter of 60 nm or more is diluted 2 to 5 times with a solvent.

10. The manufacturing method of a carrier for a double-side polishing apparatus according to claim 2,
 wherein the starting-up polishing step is performed using an aqueous alkaline solution in which a polishing agent having an average adhesive-grain diameter of 60 nm or more is diluted 2 to 5 times with a solvent.

11. The manufacturing method of a carrier for a double-side polishing apparatus according to claim 3,
 wherein the starting-up polishing step is performed using an aqueous alkaline solution in which a polishing agent having an average adhesive-grain diameter of 60 nm or more is diluted 2 to 5 times with a solvent.

12. The manufacturing method of a carrier for a double-side polishing apparatus according to claim 4,
 wherein the starting-up polishing step is performed using an aqueous alkaline solution in which a polishing agent having an average adhesive-grain diameter of 60 nm or more is diluted 2 to 5 times with a solvent.

13. The manufacturing method of a carrier for a double-side polishing apparatus according to claim 5,
 wherein the starting-up polishing step is performed using an aqueous alkaline solution in which a polishing agent having an average adhesive-grain diameter of 60 nm or more is diluted 2 to 5 times with a solvent.

14. The manufacturing method of a carrier for a double-side polishing apparatus according to claim 6,
 wherein the starting-up polishing step is performed using an aqueous alkaline solution in which a polishing agent having an average adhesive-grain diameter of 60 nm or more is diluted 2 to 5 times with a solvent.

15. The manufacturing method of a carrier for a double-side polishing apparatus according to claim 7,
 wherein the starting-up polishing step is performed using an aqueous alkaline solution in which a polishing agent having an average adhesive-grain diameter of 60 nm or more is diluted 2 to 5 times with a solvent.

16. The manufacturing method of a carrier for a double-side polishing apparatus according to claim 8,
 wherein the starting-up polishing step is performed using an aqueous alkaline solution in which a polishing agent having an average adhesive-grain diameter of 60 nm or more is diluted 2 to 5 times with a solvent.

17. The manufacturing method of a carrier for a double-side polishing apparatus according to claim 1,
 wherein the measuring step is performed again after the starting-up polishing step, and the setting step, the starting-up polishing step, and the measuring step are repeated until the difference between the front protruding amount and the back protruding amount measured in the measuring step reaches to 5 μm or less.

18. The manufacturing method of a carrier for a double-side polishing apparatus according to claim 16,
   wherein the measuring step is performed again after the starting-up polishing step, and
   the setting step, the starting-up polishing step, and the measuring step are repeated until the difference between the front protruding amount and the back protruding amount measured in the measuring step reaches to 5 μm or less.

19. A method of double-side polishing a wafer, comprising:
   disposing the carrier manufactured by the manufacturing method according to claim 1 between an upper turn table and a lower turn table to which polishing pads are attached; and
   double-side polishing the wafer while holding the wafer in the holding hole formed in the carrier.

20. A method of double-side polishing a wafer, comprising:
   disposing the carrier manufactured by the manufacturing method according to claim 18 between an upper turn table and a lower turn table to which polishing pads are attached; and
   double-side polishing the wafer while holding the wafer in the holding hole formed in the carrier.

* * * * *